United States Patent
Wu

[11] Patent Number: 6,117,756
[45] Date of Patent: Sep. 12, 2000

[54] METHOD OF FORMING HIGH DENSITY AND LOW POWER FLASH MEMORIES WITH A HIGH CAPACITIVE-COUPLING RATIO

[75] Inventor: Shye-Lin Wu, Hsinchu, Taiwan

[73] Assignee: Texas Instruments - Acer Incorporated, Hsinchu, Taiwan

[21] Appl. No.: 09/336,869

[22] Filed: Jun. 18, 1999

Related U.S. Application Data

[63] Continuation-in-part of application No. 09/036,038, Mar. 6, 1998.

[51] Int. Cl.[7] .............................................. H01L 21/3205
[52] U.S. Cl. .......................................... 438/594; 257/321
[58] Field of Search .................................. 438/594, 787, 438/788, 257, 263, 528, 585, 910

[56] References Cited

U.S. PATENT DOCUMENTS

| | | | |
|---|---|---|---|
| 5,837,585 | 11/1998 | Wu et al. | 438/264 |
| 5,861,347 | 1/1999 | Maiti et al. | 438/787 |
| 6,008,517 | 12/1999 | Wu | 257/321 |

*Primary Examiner*—David Nelms
*Assistant Examiner*—Dung A Le
*Attorney, Agent, or Firm*—Harness, Dickey & Pierce, P.L.C.

[57] ABSTRACT

The method for forming flash memory includes the following steps. At first, a semiconductor substrate with an isolation region formed thereupon is provided. The semiconductor substrate has a pad oxide layer and a first nitride layer formed thereover. A portion of the first nitride layer and a portion of the pad oxide layer are removed to define a gate region. A first oxide layer is formed and then a sidewall structure is formed. The semiconductor substrate is doped with first type dopants. A first thermal process is performed to form a second oxide layer and to drive in the first type dopants. The sidewall structure and the first nitride layer are then removed, and a first conductive layer is then formed over the substrate. A doping process is performed to dope the pad oxide layer, the first oxide layer, and the second oxide layer by implanting second type dopants through the first conductive layer. A second thermal process is performed and a portion of the first conductive layer is removed to define a floating gate. A dielectric layer is formed over the semiconductor substrate and a second conductive layer is then formed thereover as a control gate.

20 Claims, 3 Drawing Sheets

METHOD OF FORMING HIGH DENSITY AND LOW POWER FLASH MEMORIES WITH A HIGH CAPACITIVE-COUPLING RATIO

This is a continuation-in-part of U.S. patent application Ser. No. 09/036,038, filed Mar. 6, 1998.

CROSS REFERENCE TO RELATED APPLICATIONS

This invention is a continuation-in-part application of an application filed Mar. 6, 1998, under the same title of "METHOD OF FORMING HIGH DENSITY AND LOW POWER FLASH MEMORIES WITH A HIGH CAPACITIVE-COUPLING RATIO" which is assigned to same assignee with the same inventor as the present application.

FIELD OF THE INVENTION

The present invention relates to memory devices, and more specifically to the semiconductor fabrication process of memory devices. The invention proposes a method of forming high density and low power flash memories with a high capacitive-coupling ratio.

BACKGROUND OF THE INVENTION

Memory devices are one of the most important devices for the storing of data and information. By storing data electrically in memory devices, the data can be accessed with ultra high speed for various applications. The progress in memory device fabrication technology has made memories become a highly reliable and valuable device for a great amount of data reading and data writing access within an extremely short time. Various types of memories have been developed for a variety of applications like computation and communications systems.

An ideal storage device must have several characteristics. Numerous important applications of memory devices are specified with highly reliable and high speed operations. Low cost is needed for the explosively increasing demand on the increased storage capability with a great number of storage units. High performance and high density are both important factors for performing reliable and high speed operations with the least volume needed for the storage devices. Low power dissipation are highly demanded for providing longer operation time or greener operations especially for portable devices with limited capacity of power supply. Non-volatile (or least refreshing characteristics) is needed for reliability, safety, and low power data storage.

Flash memory has became a valuable choice in the market of portable electrical devices and systems. High density and low power flash memories are required for future portable computer and telecommunication applications. In the article "Low Voltage NVG™: A New High Performance 3V/5V Flash Technology for Portable Computing and Telecommunications Applications" (in IEEE Transactions on Electron Devices, Vol. 43, No. 9, p. 1510, 1996), A. Bergemont et al. introduce a new concept for low voltage NOR Virtual Ground (NVG™) flash memory with a fast access time. It is mentioned that the portable telecommunications and computing market has become a major driving force in semiconductor IC (Integrated Circuits) design and technology. The growing market requires low power, high density, and electrically re-writable non-volatile memories, either embedded or stand-alone. Flash memory is another choice other than EEPROM (Electrically Erasable and Programmable ROM) because of its small size and improved reliability. New concepts and modifications of NVG™ flash memory is proposed in the work with thinner field oxide in the array to improve gate coupling of cells and result in faster programming and erasing.

The capacitive-coupling ratio is a vital factor in determining the functional characteristics of the flash memory. For achieving a high density and low power flash memory, a cell structure with contactless array and high capacitive-coupling ratio have been proposed. H. Shirai et al. developed a self-aligned memory cell for 256 Mbit flash memory in 1995 (in "A 0.54 $\mu m^2$ Self-Aligned, HSG Floating Gate Cell (SAHF Cell) for 256 Mbit Flash Memories", in IEDM Tech. Dig., p. 653, 1995). Hemispherical-grained (HSG) polysilicon is applied to floating gate to extend the upper surface area double that of the floating gate in comparison with the conventional ones. A high capacitive-coupling ratio of 0.8 and buried $n^+$ diffusion layers which are self-aligned to the floating gate polysilicon are realized in their work.

However, a contactless array with a high capacitive-coupling ratio is difficult to be manufactured in the conventional process. Y. S. Hisamune et al. have described in the work "A High Capacitive-Coupling Ratio (HiCR) Cell for 3 V-Only 64 Mbit and Future Flash Memories" (in IEDM Tech. Dig., p.19, 1993) that a great number of total process-steps are needed for manufacturing a memory cell. The complicate process-steps in the conventional fabrication process of flash memory greatly increase the cost and efforts in achieving a high capacitive-coupling ratio.

A thinner tunnel oxide in flash memory is also recognized as an important factor in enhancing electron injection efficiency. But it is difficult to fabricate a thin tunnel oxide with a high electron injection efficiency and a large charge-to-breakdown for low power nonvolatile memories. The inventor of the present invention has reported that scaling down the thin tunnel oxide for lower voltage operation may face limitations in defect density, retention due to stress-induced leakage and charge leakage due to direct tunneling (in "Characterization of Thin Textured Tunnel Oxide Prepared by Thermal Oxidation of Thin Polysilicon Film on Silicon" by S. L. Wu et al., in IEEE Transactions on Electron Devices, Vol. 43, No. 2, p. 287, 1996). For the thicker polyoxide which uses the rough polysilicon/oxide interface as an efficient electron injector, the very large electron trapping rate and the writing-erasing memory window closing due to electron trapping will limit memory endurance. Moreover, the reduction in thickness does not give a proportional reduction in the programming voltage because of the decrease on the electric field enhancement factor with the scaling-down of the thickness of polyoxide. The characteristics of thin textured tunnel oxide prepared by thermal oxidation of thin polysilicon film on Si substrate (TOPS) are studied in detail in the paper.

SUMMARY OF THE INVENTION

The present invention proposes a method of forming flash memories. The method can provide high density and low power flash memories with a high capacitive-coupling ratio. A simpler process than the conventional process in fabricating flash memories is provided. A thin tunnel oxide with a high electron injection efficiency and a large charge-to-breakdown for low power non-volatile memories can be achieved.

The method in the present invention for forming a memory cell includes the following steps. At first, a semiconductor substrate with an isolation region formed thereupon is provided. The semiconductor substrate has a pad oxide layer and a first nitride layer formed over. The pad oxide layer is formed on a region uncovered by the isolation region on the semiconductor substrate. The first nitride layer is formed over the pad oxide layer. A portion of the first nitride layer and of the pad oxide layer are removed to define a gate region. A first oxide layer is formed on a region uncovered by the gate region and the isolation region on the semiconductor substrate. A sidewall structure is formed on the gate region and the semiconductor substrate is doped with first type dopants. A first thermal process is performed to form a second oxide layer on a region uncovered by the sidewall structure, the gate region, and the isolation region. The first type dopants are driven in at the same time.

The sidewall structure and the first nitride layer are then removed, and a first conductive layer is then formed over the substrate. A doping process is performed to dope the pad oxide layer, the first oxide layer, and the second oxide layer by implanting second type dopants through the first conductive layer. A second thermal process is performed and a portion of the first conductive layer is removed to define a floating gate. A dielectric layer is formed over the semiconductor substrate and a second conductive layer is then formed over the semiconductor substrate as a control gate.

As the preferred embodiment, the second type dopants in the first oxide layer can be dopants like silicon, germanium, nitrogen, argon, arsenic, and combination thereof. The dopants implanted into the first oxide layer can act as traps for electrons to enhance tunneling effect. The electron injection efficiency of the first oxide layer can be significantly increased. Thus the injection current can be enhanced and a low power and high speed operation of the memory cell can be achieved.

In addition, a step of depositing an undoped hemispherical grain (HSG) silicon film on the first conductive layer can be added after the first conductive layer is formed. The surface area of the first conductive layer as a floating gate can be significantly raised.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings as follows.

DETAILED DESCRIPTION OF THE PREFERRED EMBODIMENT

The present invention proposes a method for forming flash memories. High density and low power flash memories with a high capacitive-coupling ratio can be formed. Flash memories with small area, high density, and high reliability can be achieved through a simpler process than the conventional one. A large angle-tilted (LAT) ion implantation process is used to form a junction region with degraded concentration distribution in a single step. A tunnel oxide layer with an ion implantation treatment is formed. Enhanced tunneling effects can be achieved and raised electron injection efficiency is provided. An undoped hemispherical grain (HSG) silicon film is formed to increase the surface area of a floating gate. A high capacitive-coupling ratio is accomplished with the raised surface area. High density flash memories with low power consumption is implemented with the method disclosed in the present invention.

Figure 1:
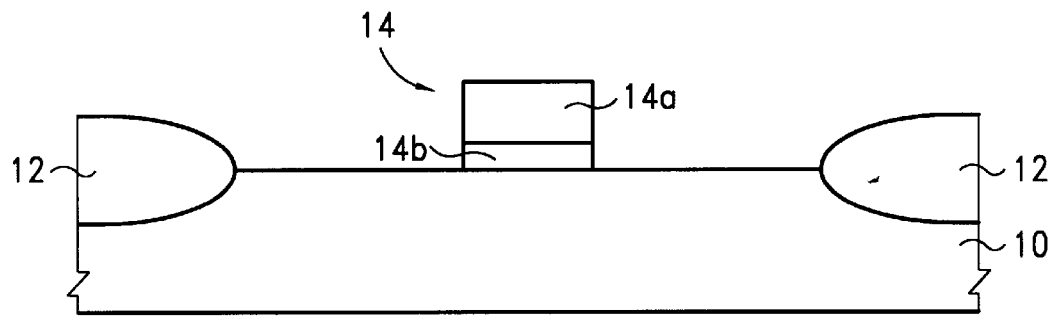
FIG. 1 illustrates a cross-sectional view of a semiconductor substrate having an isolation region and a gate region defined in the present invention.

Referring to FIG. 1, a semiconductor substrate 10 is illustrated in a cross-sectional view. A single crystalline silicon in a <100> direction is utilized preferably as the semiconductor substrate 10. An isolation region, like a field oxide (FOX) region 12, is formed on the semiconductor substrate 10. The formation process of the FOX region 12 are as follows. In general, a thin silicon oxide layer is thermally grown on the semiconductor substrate 10 with a thickness in the range of about 50 angstroms to 300 angstroms. A silicon nitride layer is then deposited thereon. The silicon nitride layer is utilized as a layer for inhibiting the FOX growth on an active region of the semiconductor substrate 10.

The silicon nitride layer is then patterned to etch off the region for forming the FOX. The semiconductor substrate 10 is subjected to a thermal process. As an example, a thermal process performed in a hot steam within an oxygen-containing ambient is applied. A region of the silicon oxide layer uncovered by the silicon nitride layer is grown to become the FOX region 12 to serve as the isolation region shown in FIG. 1. Thus the semiconductor substrate 10, after the formation of the FOX region 12, has a pad oxide layer and a first nitride layer formed over on a region other than the FOX region 12. The isolation region on the semiconductor substrate 10 can be created through other isolation technologies which are well known in the art, like the trench isolation and so on, with the same purpose in splitting respective active regions or memory cells.

The semiconductor substrate 10 with the formation of the isolation region 12, a pad oxide layer, and a first nitride layer is provided as the starting material of the present invention. A portion of the first nitride layer and of the pad oxide layer are removed to define a gate region 14 with the remaining first nitride layer 14a and the remaining pad oxide layer 14b, as indicated in FIG. 1. A well known patterning process can be employed to form the gate region 14. A lithography process is performed first to define the specified location and an etching process like an isotropic etching, or more specifically a plasma etching or a reactive ion etching (RIE) is applied then to form the gate region 14.

Figure 2:
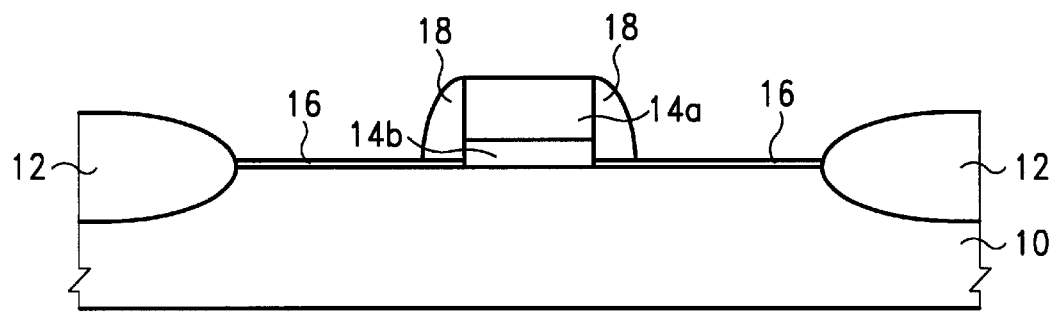
FIG. 2 illustrates a cross-sectional view of forming a first oxide layer and a sidewall structure in the present invention.

Referring to FIG. 2, a first oxide layer 16 is formed on a region uncovered by the gate region 14 and the isolation region 12 on the semiconductor substrate 10. In general, the first oxide layer 16 is grown thermally from the semiconductor substrate 10 to serve as a tunnel oxide layer. The first oxide layer 16 is thermally grown in an oxygen containing ambient from the semiconductor substrate 10 with a thickness of about 20 angstroms to 1000 angstroms, as an example. A sidewall structure 18 is formed on the gate region 14. In the case, the sidewall structure 18 can be a nitride spacer structure which is frequently applied in the semiconductor manufacturing processes for its easy formation and low cost. A nitride layer is deposited on the semiconductor substrate 10, and is then etched back by an anisotropic etching process to form the nitride spacer structure 18.

Figure 3:
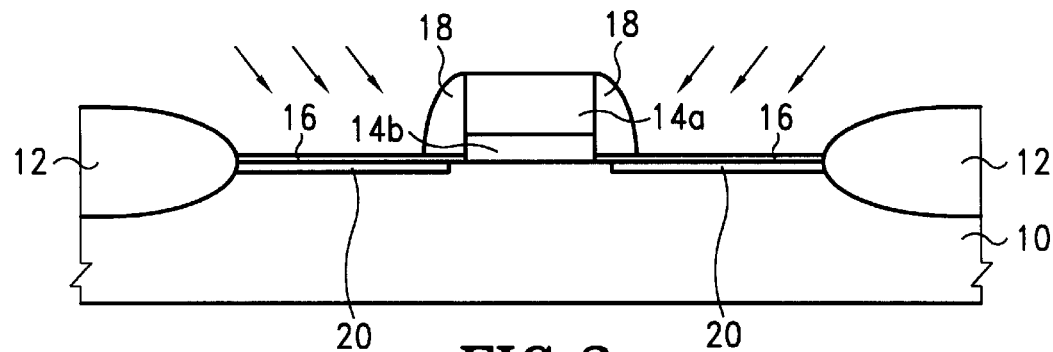
FIG. 3 illustrates a cross-sectional view of doping the semiconductor substrate with first type dopants in the present invention.

A doping process is then performed with first type dopants, as shown in FIG. 3. A large angle-tilted (LAT) ion implantation process which is tilted from a vertical line at an angle between about 10 degrees to 60 degrees, is employed in the embodiment. The dopants are implanted into the semiconductor substrate 10 through the first oxide layer 16. An energy between about 10 KeV to 150 KeV is applied with a dose between about 1E14 to 5E16 atoms/cm$^2$. For forming n$^+$ diffusions, the first type dopants can be arsenic containing dopants or phosphorous containing dopants. A junction region 20 is formed under the region uncovered by the gate region 14, the sidewall structure 18, and the isolation region 12. The junction region 20 can extend further into a region under part of the sidewall structure 18 by the angle-tilted ion implantation. Thus the junction region 20 with degraded concentration distribution can be achieved by a single step.

Figure 4:
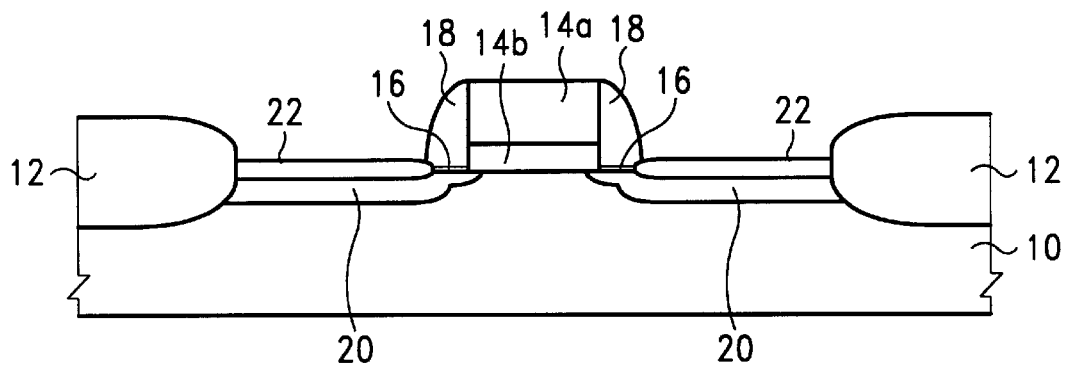
FIG. 4 illustrates a cross-sectional view of performing a first thermal process to form a second oxide layer and to drive in the first type dopants in the present invention.

Referring to FIG. 4, a thermal process is performed to form a second oxide layer 22 on a region uncovered by the sidewall structure 18, the gate region 14, and the isolation region 12. The first type dopants in the junction region 20 are also diffused and driven in by the thermal process. As an example, the first thermal process can be a steam oxidation process to form the second oxide layer 22. The second oxide layer 22 is grown to have a thickness of about 300 angstroms to 1000 angstroms to serve as an insulation oxide over the junction region 20. The junction region 20 formed by the large angle-tilted (LAT) ion implantation can further extends into a region under a portion of the pad oxide layer 14b by diffusion in the thermal process.

Figure 5:
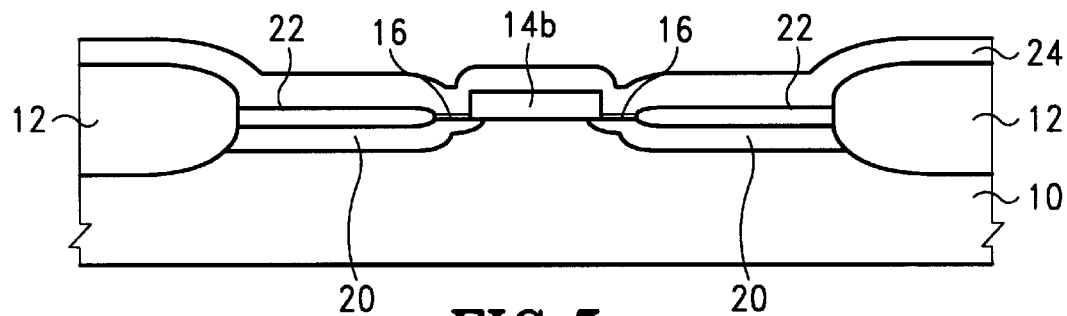
FIG. 5 illustrates a cross-sectional view of removing the sidewall structure and the first nitride layer and forming a first conductive layer over the semiconductor substrate in the present invention.

Referring to FIG. 5, the sidewall structure 18 is removed simultaneously with the first nitride layer 14a. Typical etch process like wet etch by hot phosphoric acid can be applied. A first conductive layer 24 is formed over the semiconductor substrate 10. In general, the first conductive layer 24 can be a doped polysilicon layer which is formed chemical vapor deposition. As is well known in the art, the doped polysilicon layer 24 can be formed by an in-situ doped chemical vapor deposition. Besides, a chemical vapor deposition of undoped polysilicon layer followed by a doping or an ion implantation process can be used alternatively in forming the doped polysilicon layer 24. For n$^+$-doped polysilicon layer, ions like phosphorous or arsenic can be utilized.

Figure 6:
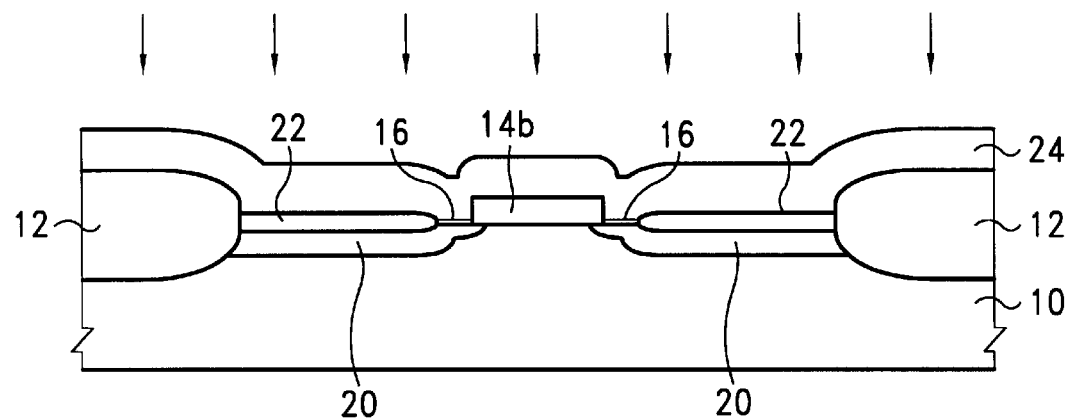
FIG. 6 illustrates a cross-sectional view of doping oxide layers through the first conductive layer with second type dopants like silicon, germanium, nitrogen, argon, arsenic, and so forth in the present invention.

Turning to FIG. 6, the pad oxide layer 14b, the first oxide layer 16, and the second oxide layer 22 are then doped with second type dopants, preferably by an ion implantation process implanting the second type dopants through the first conductive layer 24 into the pad oxide layer 14b, the first oxide layer 16, and the second oxide layer 22. A heavy dose of ions are implanted to perform a treatment to the oxide layers with a raised implantation energy between about 30 KeV to 160 KeV at a dose between about 1E14 atoms/cm$^2$ to 1E17 atoms/cm$^2$.

In the present invention, a wide variety of dopants can be used as the second type dopants, like silicon, germanium, nitrogen, argon, arsenic, and combination thereof. The implanted dopants like silicon and germanium can form electron traps to improve the tunneling effect of the oxide layers. The oxide layers implanted with dopants of nitrogen, argon and arsenic are found to show enhanced tunneling effects, mainly resulting from the modified silicon oxide atomic configuration under the implantation. The electron injection efficiency of the tunnel oxide, or namely the first oxide 16 can be significantly increased. Thus the injection current can be enhanced and a low power and high speed operation of the memory cell can be achieved.

In the process of implanting the pad oxide layer 14b, the first oxide layer 16, and the second oxide layer 22, some peripheral regions on individual chips which do not need the implantation treatment region can be shielded by a mask layer like a photoresist layer having a prescribed pattern defined thereon. By implanting the dopants through the first conductive layer 24 of silicon, the tunnel oxide of the first oxide layer 16 can be well protected by the first conductive layer 24 from the contamination of photoresist materials. The tunneling efficiency of the tunnel oxide and the reliability of the device are significantly raised with the approach of the present invention in doping the pad oxide layer 14b, the first oxide layer 16, and the second oxide layer 22 through the first conductive layer 24.

T. Hori et al. discloses the trapping effect in the work "A MOSFET with Si-implanted Gate-SiO$_2$ Insulator for Non-volatile Memory Applications" (in IEDM Tech. Dig., p. 469, 1992). A MOSFET with Si-implanted gate-SiO$_2$ insulator (Memory-Insulator Transistor or MEIT) is fabricated and investigated especially with emphasis on its feasibility for nonvolatile memory applications in their work. A high dose Si$^+$ implantation into thermal SiO$_2$ introduces excess-Si cites acting as traps responsible for a memory effect. A large V$_T$ window is achieved. By taking advantage of the memory effect, it is found that MEIT achieves sufficient programming characteristics as a Flash E$^2$PROM as well as simplicity of the single polysilicon gate process.

After the implantation, a thermal process is preferably performed to anneal the surface of the first conductive layer 24 after the bombardment of the ions. The thermal process for recovering the implant-induced damages can also be performed in later processes to have the same effect.

Figure 7:
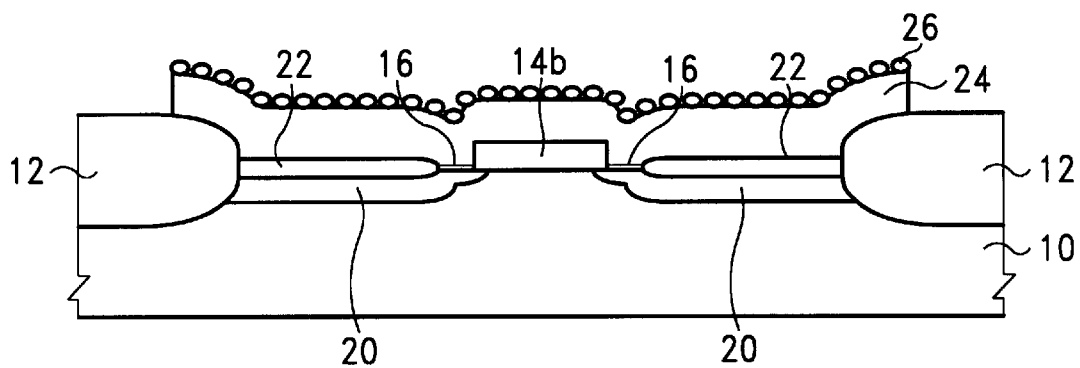
FIG. 7 illustrates a cross-sectional view of depositing an undoped hemispherical grain (HSG) silicon film on the first conductive layer and of removing a portion of the first conductive layer to define a floating gate in the present invention.

To increase the surface area of the doped polysilicon layer 24 which acts as a floating gate, a step of depositing an undoped hemispherical grain (HSG) silicon film 26 can be added. Referring to FIG. 7, the undoped hemispherical grain (HSG) silicon film 26 is formed over the doped polysilicon layer 24 and thus the surface area can be raised significantly. A portion of the doped polysilicon layer 24 and the undoped hemispherical grain (HSG) silicon film 26 are then removed to define a floating gate. The portions of the doped polysilicon layer 24 and the undoped hemispherical grain (HSG) silicon film 26 which located outside the memory cell or on the isolation region 12 are removed or etched off.

Figure 8:
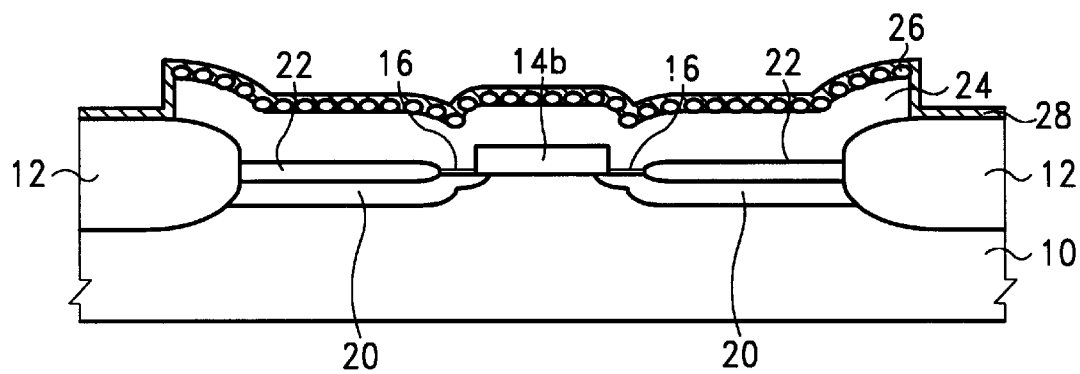
FIG. 8 illustrates a cross-sectional view of forming a dielectric layer over the semiconductor substrate in the present invention.

Referring to FIG. 8, a dielectric layer 28 is then formed over the semiconductor substrate 10 abutting the top surface of the doped polysilicon layer 24 and the undoped hemispherical grain (HSG) silicon film 26. The dielectric layer 28 can be a nitride layer or an oxynitride layer. The dielectric layer 28 is deposited over the semiconductor substrate 10 with an ultra-thin thickness of about 30 angstroms to about 250 angstroms. To enhance the quality of the dielectric layer 28, an annealing step can be performed in a nitrogen and oxygen containing ambient. The quality of the nitride layer or the oxynitride layer can be increased with a $N_2O$ annealing in the embodiment.

Figure 9:
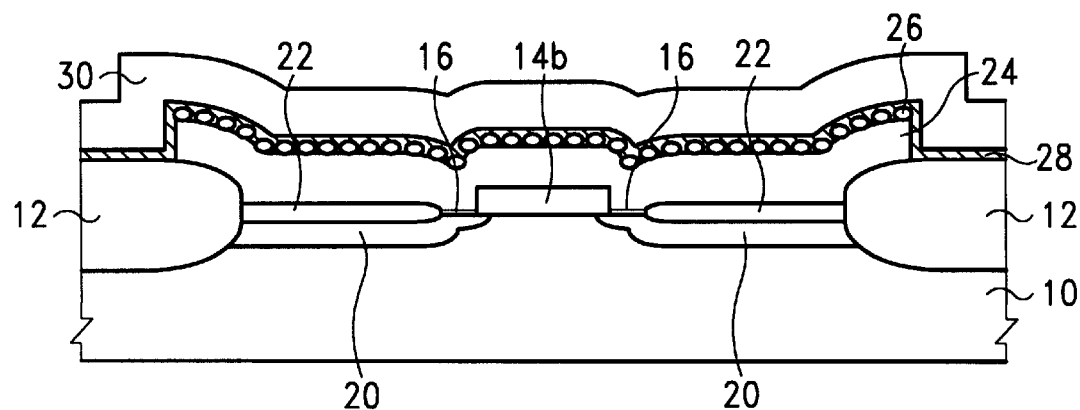
FIG. 9 illustrates a cross-sectional view of forming a second conductive layer over the semiconductor substrate in the present invention.

Finally, a second conductive layer 30 is formed over the semiconductor substrate 10 to act as a control gate and finish the formation of flash memories, as shown in FIG. 9. In the same way as the first conductive layer 24, the second conductive layer 30 can be a doped polysilicon layer which is formed by chemical vapor deposition. The doped polysilicon layer 30 can be formed by an in-situ doped chemical vapor deposition. Besides, a chemical vapor deposition of undoped polysilicon layer followed by a doping or an ion implantation process can be employed alternatively in forming the doped polysilicon layer 30. For $n^+$-doped polysilicon layer, ions like phosphorous or arsenic can be utilized.

The present invention proposes a method for forming flash memories. High density and low power flash memories with a high capacitive-coupling ratio can be formed with a simpler process than conventional one. The capacitive-coupling ratio in this structure is larger than the conventional ones. The raised surface area of the floating gate and the increased quality of the dielectric layer are the main issue. The electron injection efficiency of the tunnel oxide could be enhanced by the implantation treatment. High density flash memories with low power consumption are implemented with the method disclosed in the present invention.

As is understood by a person skilled in the art, the foregoing descriptions of the preferred embodiment of the present invention is illustrative of the present invention rather than limitations thereon. They are intended to cover various modifications and similar arrangements included within the spirit and scope of the appended claims. The scope of the claims should be accorded the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method for forming a memory cell, said method comprising the steps of:

providing a semiconductor substrate with an isolation region formed upon, said semiconductor substrate having a pad oxide layer and a first nitride layer formed over, said pad oxide layer formed on a region uncovered by said isolation region on said semiconductor substrate, and said first nitride layer formed over said pad oxide layer;

removing a portion of said first nitride layer and of said pad oxide layer to define a gate region;

forming a first oxide layer on a region uncovered by said gate region and said isolation region on said semiconductor substrate;

forming a sidewall structure on said gate region;

doping said semiconductor substrate with first type dopants;

performing a first thermal process to form a second oxide layer on a region uncovered by said sidewall structure, said gate region, and said isolation region, and to drive in said first type dopants;

removing said sidewall structure and said first nitride layer;

forming a first conductive layer over said semiconductor substrate;

doping said pad oxide layer, said first oxide layer, and said second oxide layer by implanting second type dopants through said first conductive layer into said pad oxide layer, said first oxide layer, and said second oxide layer, said second type dopants being selected from the group consisting of nitrogen, argon, arsenic, and the combination thereof;

performing a second thermal process to said semiconductor substrate;

removing a portion of said first conductive layer to define a floating gate;

forming a dielectric layer over said semiconductor substrate; and forming a second conductive layer over said semiconductor substrate.

2. The method of claim 1 further comprising a step of depositing an undoped hemispherical grain (HSG) silicon film on said first conductive layer after said first conductive layer is formed.

3. The method of claim 1, wherein said first oxide layer is a tunnel oxide layer which is thermally grown in an oxygen containing ambient from said semiconductor substrate with a thickness of about 30 angstroms to 500 angstroms.

4. The method of claim 1, wherein said sidewall structure comprises a nitride spacer structure, which is formed by depositing and etching back a second nitride layer on said semiconductor substrate.

5. The method of claim 1, wherein said step of doping said first type dopants is performed with a large angle-tilted (LAT) ion implantation process at an angle between about 10 degrees to 60 degrees.

6. The method of claim 1, wherein said first type dopants are implanted with an energy between about 10 KeV to 150 KeV at a dose between about 1E14 to 5E16 atoms/$cm^2$, said first type dopants are arsenic containing dopants or phosphorous containing dopants.

7. The method of claim 1, wherein said first thermal process is a steam oxidation process to form said second oxide layer.

8. The method of claim 1, wherein said second type dopants are implanted with an energy between about 30 KeV to 160 KeV at a dose between about 1E14 to 1E17 atoms/$cm^2$.

9. The method of claim 1, wherein said first conductive layer comprises a doped polysilicon layer which is formed by chemical vapor deposition.

10. The method of claim 1, wherein said dielectric layer comprises a nitride layer or an oxynitride layer which is deposited over said semiconductor substrate.

11. The method of claim 10 further comprising a step of annealing said dielectric layer in a nitrogen and oxygen containing ambient after the formation of said dielectric layer.

12. The method of claim 1, wherein said second conductive layer comprises a doped polysilicon layer which is formed by chemical vapor deposition to serve as a control gate.

13. A method for forming a memory cell, said method comprising the steps of:

providing a semiconductor substrate with an isolation region formed upon, said semiconductor substrate having a pad oxide layer and a first nitride layer formed over, said pad oxide layer formed on a region uncovered by said isolation region on said semiconductor substrate, and said first nitride layer formed over said pad oxide layer;

removing a portion of said first nitride layer and of said pad oxide layer to define a gate region;

forming a first oxide layer on a region uncovered by said gate region and said isolation region on said semiconductor substrate;

forming a sidewall structure on said gate region;

doping said semiconductor substrate with first type dopants by a large angle-tilted (LAT) ion implantation process at an angle between about 10 degrees to 60 degrees;

performing a first thermal process to form a second oxide layer on a region uncovered by said sidewall structure, said gate region, and said isolation region, and to drive in said first type dopants;

removing said sidewall structure and said first nitride layer;

forming a first conductive layer over said semiconductor substrate;

doping said pad oxide layer, said first oxide layer, and said second oxide layer by implanting second type dopants through said first conductive layer into said pad oxide layer, said first oxide layer, and said second oxide layer, said second type dopants being selected from the group consisting of nitrogen, argon, arsenic, and the combination thereof;

performing a second thermal process to said semiconductor substrate;

depositing an undoped hemispherical grain (HSG) silicon film on said first conductive layer;

removing a portion of said undoped hemispherical grain (HSG) silicon film and of said first conductive layer to define a floating gate;

forming a dielectric layer over said semiconductor substrate, said dielectric layer comprising a nitride layer or an oxynitride layer; and forming a second conductive layer over said semiconductor substrate.

14. The method of claim 13, wherein said first oxide layer is a tunnel oxide layer which is thermally grown in an oxygen containing ambient from said semiconductor substrate with a thickness of about 30 angstroms to 500 angstroms.

15. The method of claim 13, wherein said sidewall structure comprises a nitride spacer structure, which is formed by depositing and etching back a second nitride layer on said semiconductor substrate.

16. The method of claim 13, wherein said first type dopants are implanted with an energy between about 10 KeV to 150 KeV at a dose between about 1E14 to 5E16 atoms/$cm^2$, said first type dopants are arsenic containing dopants or phosphorous containing dopants.

17. The method of claim 13, wherein said first thermal process is a steam oxidation process to form said second oxide layer.

18. The method of claim 13, wherein said second type dopants are implanted with an energy between about 30 KeV to 160 KeV at a dose between about 1E14 to 1E17 atoms/$cm^2$.

19. The method of claim 13, wherein said first conductive layer and said second conductive layer comprise doped polysilicon layers which are formed by chemical vapor deposition.

20. The method of claim 13 further comprising a step of annealing said dielectric layer in a $N_2O$ containing ambient.

* * * * *